United States Patent [19]

Bauerschmidt

[11] Patent Number: 5,201,064
[45] Date of Patent: Apr. 6, 1993

[54] MULTIPLE-LINE SUPERHETERODYNE TRANSMISSION AND RECEPTION DEVICE

[75] Inventor: Werner Bauerschmidt, Langenzenn, Fed. Rep. of Germany

[73] Assignee: Grundig E.M.V., Furth/Bay, Fed. Rep. of Germany

[21] Appl. No.: 725,013

[22] Filed: Jul. 3, 1991

[30] Foreign Application Priority Data

Jul. 4, 1990 [DE] Fed. Rep. of Germany ....... 4021294

[51] Int. Cl.$^5$ ............................................... H04B 1/40
[52] U.S. Cl. ........................................ 455/75; 455/86
[58] Field of Search ............... 455/75, 76, 67, 206, 455/86, 87, 67.1, 67.3

[56] References Cited

U.S. PATENT DOCUMENTS

| 4,027,242 | 5/1977 | Yamanaka | 455/77 |
| 4,097,805 | 6/1978 | Fujii | 455/76 |
| 4,542,531 | 9/1985 | Fukumura | 455/76 |
| 4,633,511 | 12/1986 | Koga et al. | 455/86 |
| 5,014,340 | 5/1991 | Wren | 455/99 |

Primary Examiner—Reinhard J. Eisenzopf
Assistant Examiner—C. Belzer
Attorney, Agent, or Firm—Kane, Dalsimer, Sullivan, Kurucz, Levy, Eisele and Richard

[57] ABSTRACT

A transmitting and multiple line superheterodyne receiving device and transmitting device for the communications, particularly telecommunications field is disclosed. To suppress the modulation signal components otherwise generated by the transmitting device, a compensation device is provided which includes a frequency control circuit with a voltage controlled oscillator, whose nominal frequency corresponds to the sum or difference of the first and second intermediate frequencies and which is connected to a second receiving mixer.

4 Claims, 2 Drawing Sheets

MULTIPLE-LINE SUPERHETERODYNE TRANSMISSION AND RECEPTION DEVICE

BACKGROUND OF THE INVENTION

1. Field of the Invention

This invention pertains to an n-line superheterodyne transmission and reception device in the communications field, especially the telecommunications field.

2. Background of the Invention

N-line (i.e., multiple line) superheterodyne receivers with n-line frequency conversion, such as are used with radio telephone devices, are well known in the prior art.

For example, a wireless set with a single superheterodyne receiver is described in European Patent Office application EP-B1-0 089 649, wherein the high frequency oscillation of the transmission oscillator is positioned between the receiving frequencies of two adjacent radio channels and is fed to a mixer. In view of the double use of the carrier oscillation which is generated in the transmission branch, not only can an oscillator be omitted in the receiving branch, but also interference due to a plurality of oscillators can be eliminated. However, such a circuit concept is disadvantageous as the intermediate frequency signal includes modulation signal components generated by the transmitter in addition to the modulation of the received signal.

In order to eliminate interference, particularly crosstalk, from a received voice signal on a wireless set through loudspeakers, the receiver must eliminate or suppress modulation signal components which are coming from the transmitter.

In practice, two different methods have been shown to be useful. The first method include the subtracting of the signal fed to the transmission modulated by the output signal of the demodulator in the low frequency range. The second method includes modulation by a second mixer with a counter phase signal for the modulation of the transmission signal. Both of these methods are known and are disclosed in German Patent DE-AS 1,002,805.

The wireless set disclosed in the aforementioned DE-AS 1,002,085 is operable as a wireless relay station or could communicate via a telephone line. Therefore, the high frequency carrier signal of the transmission branch which is modulated with its own signal is also superpositioned with the received signal for generating an intermediate frequency in addition to the generation of the transmission signal. This superimposed signal which is taken from the transmission branch includes the modulation corresponding to the transmitted signal. For compensation of the modulated component caused by the modulation signal, two embodiments of a compensation apparatus are disclosed in the aforementioned DE-AS 1,002,805 which are provided between the transmission and reception branch and which each include an amplifier and a phase shifting member.

The first method and apparatus includes a pure frequency modulation active compensation, while the second method and apparatus includes an additional modulation operation for compensation.

The first method is advantageous in that the individual electronic components must be design for use only in the low frequency range. Therefore, less expensive components may be used. However, this method is disadvantageous in that the running times caused by the ZF-filters must be compensated by running time components. This again causes a relatively high overall cost for the circuitry and further requires adjustment of the compensation apparatus.

The second method is advantageous because the modulation and the compensating signals pass through the second intermediate frequency filter simultaneously. In comparison with the first method, the compensation of the remaining running time differences are substantially simplified. However, it is disadvantageous because the frequency of the second receiving device must be very stable. Therefore, a high constant quartz oscillator is used as a second quartz oscillator. In order modulate such a quartz oscillator, a very expensive circuit is required. Moreover, the resulting circuit is disadvantageous in that the characteristic curve is non-linear.

Finally, a transmitting and a superheterodyne receiving device is disclosed in EP-B1-0 135 816, wherein the compensation device is provided with a modulator. The modulated output signal of the transmission oscillator, e.g., the transmission signal is modulated with the compensation signal (which, after passing through an amplifier and the subsequent phase shifting element, exits at its output) so that the superheterodyne receiving device is fed to a substantially remodulated signal. The frequency of this signal corresponds to the frequency of the transmission oscillator.

OBJECTS AND SUMMARY OF THE INVENTION

It is therefore an object of this invention to provide a transmission device with a related N-line superheterodyne receiving device for communication so that the intermediate frequency signal in addition to the modulation of the receiving signal does not contain modulation signal components of the transmission device.

The transmitting and receiving device in accordance with the present invention are advantageous in that the required second quartz oscillator or oscillator frequency in a 2-line superheterodyne receiving device is provided by the compensation device. The amount and the phase of the modulation of the frequency of the voltage controlled oscillator may be selected in the compensation device so that the modulation of the first receiving oscillator or transmitting oscillator may be eliminated in the second frequency range. Furthermore, it is advantageous that the bandwidth is reduced in the intermediate frequency range. A further advantage is that the superheterodyne receiving device of the present invention includes a high adjacent channel selectivity for devices include duplex operation such as automobile phones, industrial communications, or portable telephones.

Furthermore, the present invention is advantageous in that a substantially linear control characteristic curve can be generated for the voltage controlled oscillator. Furthermore, the present invention is advantageous in that the stability of the voltage controlled oscillator is assured by means of a frequency discriminator.

The compensation device of one embodiment of the present invention is provided with a mixer, which is connected to a quartz oscillator and a frequency discriminator, for use in the lower frequency range. Such a frequency discriminator is inexpensive and provides a stable frequency.

One embodiment of the transmitting-receiving device in that the circuit complexity is reduced by eliminating the mixer.

When the compensation device is provided with a quartz oscillator which is designed as a self-oscillating mixer, no non-harmonic frequencies are included in the mixed resultant signal (that is, the spectral purity of the frequency at the output of the voltage controlled oscillator is assured).

BRIEF DESCRIPTION OF THE DRAWINGS

Further objects and advantages of the invention will become apparent from the following description and claims, and from the accompanying drawings, wherein:

DETAILED DESCRIPTION OF THE PREFERRED EMBODIMENTS

Figure 1:
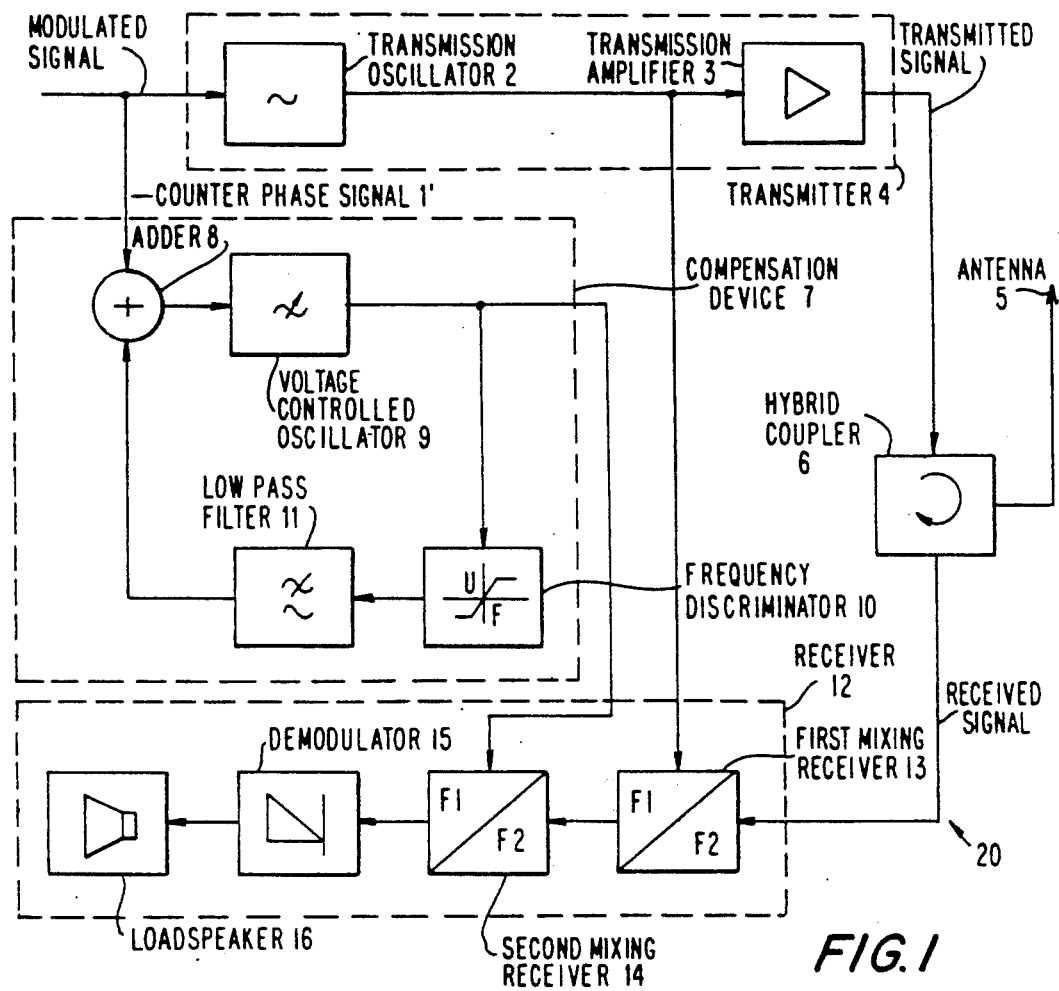
FIG. 1 is a schematic of a first embodiment of the transmitting-receiving device in accordance with the present invention, wherein the compensation device includes a frequency control circuit with a voltage controlled oscillator.

Referring now to the drawings in detail, one may see that FIG. 1 is a block diagram of the first embodiment of the present invention.

The information transmission between a base station and the associated mobile station 20 of the portable telephone apparatus is performed through a pair of wireless transmission channels. The base station is connected to the telephone network by a conventional plug so that the user may access the telephone network.

Because the base station and the mobile station 20 are connection with each other through a wireless transmission channel, the range of movement by the user is increased to a circumference of 200 meters from the connection to the telephone network.

Presently, eighty wireless channels in the frequency range of 900 Megahertz are available for information transmission in the Federal Republic of Germany. With the aforementioned transmission range, there is a low probability of interference from adjacent portable telephones. When a desired connection is requested, a scan for a free radio transmission channel is initiated by a scanning device provided in receiver 12 by mobile station 20 and the base station thereby causing a pair of radio transmission channels to be seized. In order to assure that the information transmitted between the two stations of the portable telephone apparatus cannot be heard by another portable telephone apparatus, that the proper telephone usage fees are levied and that the transmission channels are clear, a characteristic code is associated with each portable telephone apparatus which is independent from the telephone number of the subscriber.

An incoming call which is recognized by an associated control device in the base station triggers the radio signal search in the exchange line. By activating the receiver exchange key, the ratio channel scanning is initiated in the mobile station 20. The actuated characteristic exchange is described in more detail in EP-B1-0-074 940. A radio transmission channel which has been recognized as being free is seized, the transmitter 14 is activated and the characteristic code is transmitted in form of a data packet through the radio transmission channel. After the transmission of each characteristic code, the apparatus waits for a receipt data packet of the corresponding counter station. If the receipt data package is received by the counter station, it will be compared with its own characteric code by a device in the given station. During confirmation, the connection is made by the control device which is connected to the apparatus, the characteristic code flag is set and the present radio connection is monitored.

A further application for portable telephone apparatus is offered for public "telepoint" services. During "telepoint" services, the base stations are connected to public places such as train stations, airports, shopping malls, highway rest stops, etc. The owner of a suitable modular mobile phone can access the public telephone system within a circumference of 100 meters to make telephone calls.

The transmitting device 14 includes a transmission oscillator 2, which is modulated by a modulation signal 1. The transmission oscillator 2 is connected to a first intermediate frequency position with a first receiving mixer 13 for mixing the received signal which is fed through the transmitting and receiving antenna 5 and hybrid coupler 6. The first intermediate frequency corresponds to the duplex distance between the transmitting and receiving frequency of the communication transmission system. A second receiving mixer 14 is modulated with a counter phase signal for modulating the transmission oscillator 2 by means of a compensation device 7 being provided between the transmitting and receiving device 4, 12, whereby the modulated signal 1 is fed to compensation device. This compensation device 7 includes a frequency control circuit with a voltage controlled oscillator 9, with a required frequency which corresponds to the sum or difference of the first and second intermediate frequencies and which is connected to the second receiving mixer 14. The voltage controlled oscillator 9 illustrated in the embodiment of FIG. 1 is connected to an adder 8 as well as with a frequency discriminator 10, to the output of which a low pass, filter 11 is connected. The counter phase modulation signal 1' and the output signal of the low pass filter 11 are fed to the two inputs of adder 8. Demodulator 15 is connected to the second receiving mixer 14, at the output of which a voice speaker is provided. Furthermore, the 2-line superheterodyne-receiving device 12 is provided with filter (not shown) between the first and the second receiving mixers 13, 14 and between the second receiving mixer 14 and demodulator 15 which are not illustrated in FIG. 1 for the sake of clarity. Finally, a transmission amplifier 3 is provided between transmission oscillator 2 and hybrid coupler 6.

The compensation device 7 assures that the intermediate frequency signal does not receive modulation signal components from transmission device 4 along with the modulation of the received signal.

Furthermore, it is advantageous that the second quartz oscillator or oscillation frequency which otherwise is required in a 2-line superheterodyne receiving device 12 is generated by compensation device 7. The amplitude and phase of the modulation of the oscillator frequency of the voltage controlled oscillator 9 in the compensation device 7 can be selected so that the modulation generated by the first receiving oscillator or transmission oscillator 2 does not appear in the second intermediate frequency range. Furthermore, it is advantageous that the bandwidth is reduced in the intermediate frequency range and that a substantially linear control characteristic curve can be generated for the voltage controlled oscillator 9. The stability of voltage controlled oscillator is achieved by the frequency discriminator 10.

Figure 2:
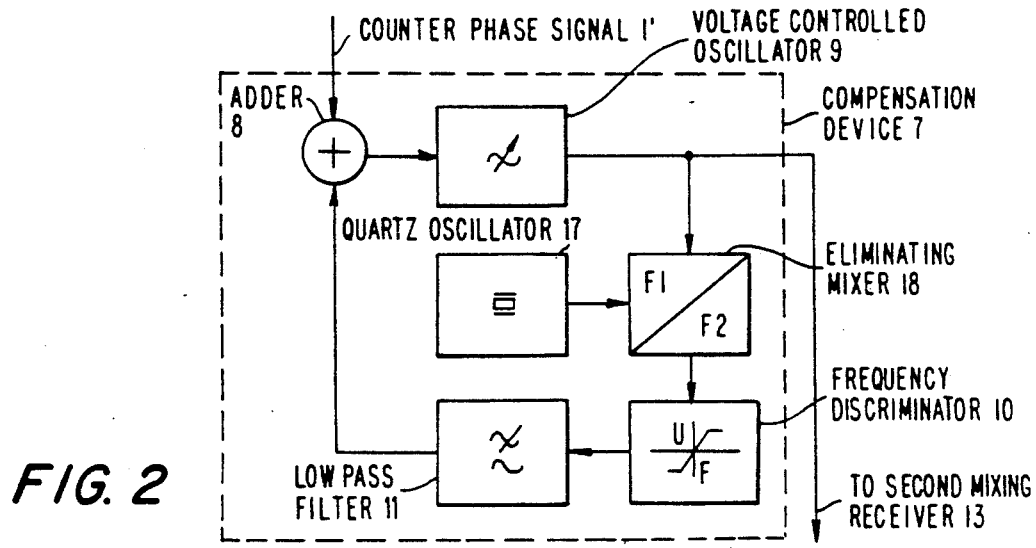
FIG. 2 is a schematic of a second embodiment of the present invention which is provided with a mixer and a quartz oscillator connected thereto.

In the second embodiment illustrated in FIG. 2, the compensation device 7 is provided with an additional mixer 18 which is provided between the voltage controlled oscillator 9 and the frequency discriminator 10 and connected to quartz oscillator 17. The frequency discriminator 10 must be designed only for a low frequency range due to the frequency conversion. Such a frequency discriminator is relatively inexpensive and has a stable frequency.

Figure 3:
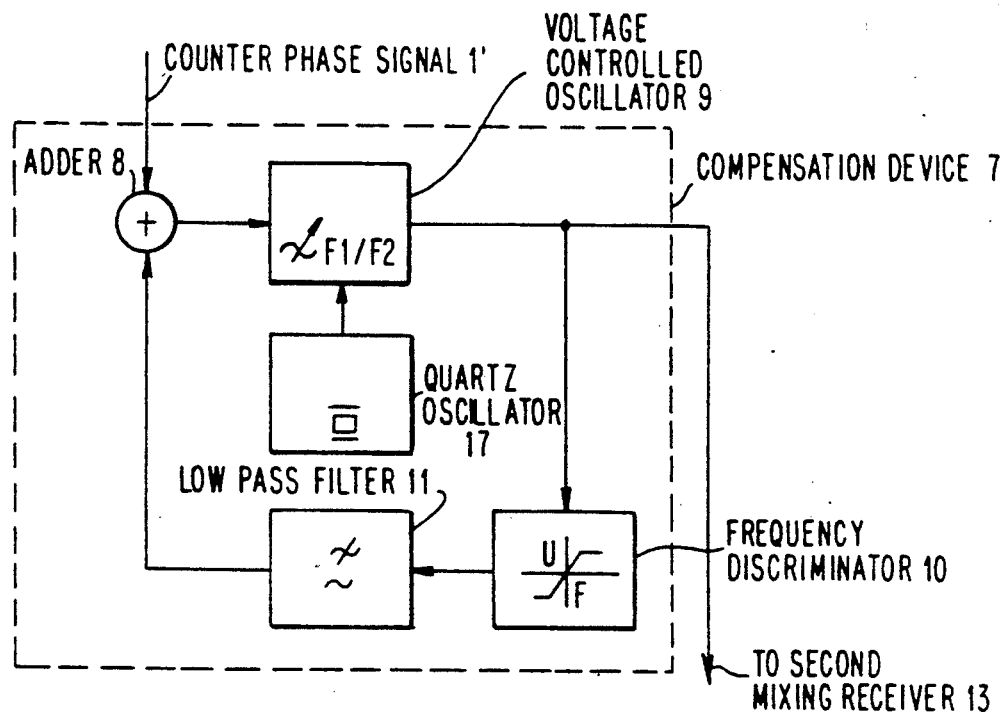
FIG. 3 is a schematic of a third embodiment of the present invention wherein the voltage controlled oscillator is designed as a self-oscillating mixer.

In the third embodiment illustrated in FIG. 3, the voltage controlled oscillator 9 is designed as a self-oscillating mixer. Quartz oscillator 17 is connected to the input of the voltage controlled oscillator. Thus, in a very simple way and manner (i.e., by eliminating mixer 18), the circuit design is reduced, but may be somewhat disadvantageous in that non-harmonic frequencies may be generated.

Figure 4:
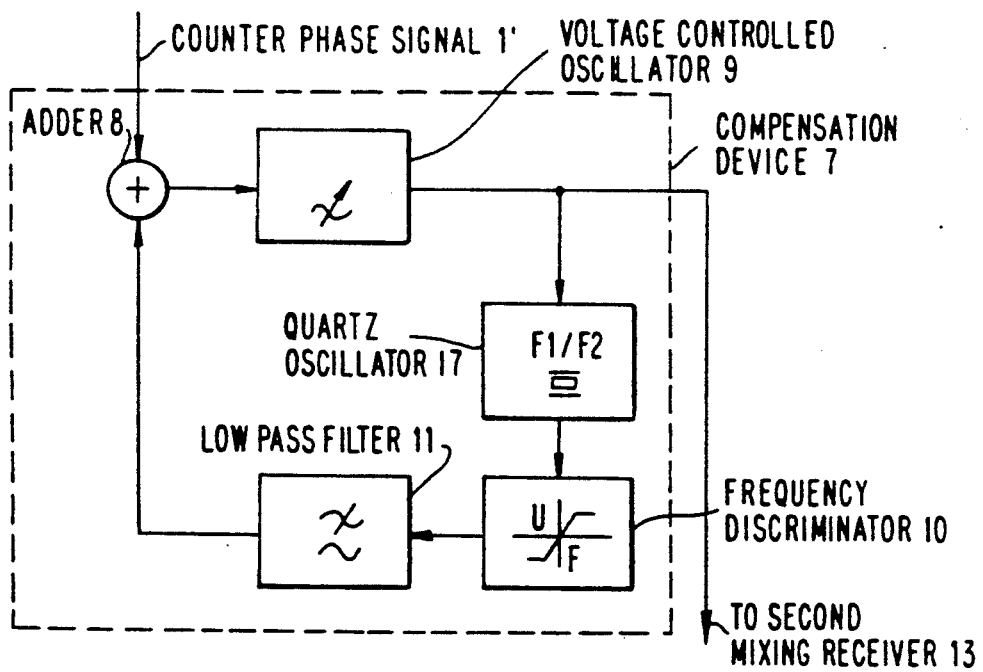
FIG. 4 is a fourth embodiment of the present invention wherein the quartz oscillator is provided with a self-oscillating mixer.

However, this disadvantage is eliminated, in the embodiment of FIG. 4 wherein a quartz oscillator 17' is provided in the compensation device 7 which is designed as a self-oscillating mixer. Quartz oscillator 17' is connected with the voltage controlled oscillator 9 as well as with the frequency discriminator 10, at the output of which a low pass filter 11 is connected. The counter phase modulation signal 1' and the output signal of the low pass filter 11 are fed to the two inputs of adder 8.

The transmitting and receiving devices in accordance with the present invention provide a wide range of applications, in particular in devices which operate in the duplex mode in communication technology. The different embodiments are not bound to a specific transmission method. In other words, thus the several aforementioned objects and advantages are most effectively attained. Although a limited number of preferred embodiments of the invention have been disclosed and described in detail herein, it should be understood that this invention is in no sense limited thereby and its scope is to be determined by that of the appended claims.

What is claimed is:

1. A transmitting and multiple line superheterodyne receiving device for radio transmission, operated in a complete duplex mode, including:
   means for receiving a modulation signal;
   first receiving mixing means responsive to said means for receiving for mixing said signal into a first intermediate frequency, whereby the first intermediate frequency substantially equals the duplex distance between a transmitting frequency and a receiving frequency of a communication system;
   a compensation means between a transmitting and a receiving device including means for modulating a second receiving mixer with a counter phase signal thereby modulating a transmission oscillator;
   whereby the modulating signal is fed to said compensation device;
   wherein said compensation device includes a frequency control circuit with a voltage controlled oscillator with a nominal frequency substantially equal to the sum or the difference of said first intermediate frequency and a second intermediate frequency and which is connected to said second receiving mixer;
   wherein said voltage controlled oscillator is connected to an adding means and to a frequency discriminator; wherein the output of said frequency discriminator is connected to a low pass filter; and wherein said counter phase modulating signal and the output of said low pass filter are fed to said adding means.

2. The transmitting and multiple line superheterodyne receiving device of claim 1 wherein said compensation device further includes a mixer between said voltage controlled oscillator and said frequency discriminator, and is connected to a quartz oscillator.

3. The transmitting and multiple line superheterodyne receiving device of claim 1 wherein said voltage controlled oscillator is a self-oscillating mixer and wherein an input of said voltage controlled oscillator is connected with a quartz oscillator.

4. A transmitting and multiple line superheterodyne receiving device for radio transmission, operated in a complete duplex mode, including:
   means for receiving a modulation signal;
   first receiving mixing means responsive to said means for receiving for mixing said signal into a first intermediate frequency, whereby the first intermediate frequency substantially equals the duplex distance between a transmitting frequency and a receiving frequency of a communication system;
   a compensation means between a transmitting and a receiving device including means for modulating a second receiving mixer with a counter phase signal thereby modulating a transmission oscillator;
   whereby the modulating signal is fed to said compensation device;
   wherein said compensation device includes a frequency control circuit with a voltage controlled oscillator with a nominal frequency substantially equal to the sum or the difference of said first intermediate frequency and a second intermediate frequency and which is connected to said second receiving mixer;
   wherein said compensation device further includes a quartz oscillator which is a self-oscillating mixer and which is connected to said voltage controlled oscillator and said frequency discriminator, an output of said frequency discriminator being connected to a low pass filter; and wherein said counter phase modulating signal and an output of said low pass filter are connected to two inputs of an adding means.

* * * * *